United States Patent
Yu

(10) Patent No.: US 11,296,306 B2
(45) Date of Patent: Apr. 5, 2022

(54) DISPLAY PANEL AND DISPLAY DEVICE WITH SHADING PART AT SIDE SURFACE OF PIXEL DEFINITION BLOCKS

(71) Applicant: Wuhan China Star Optoelectronics Semiconductor Display Technology Co., Ltd., Hubei (CN)

(72) Inventor: Wei Yu, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 330 days.

(21) Appl. No.: 16/605,456

(22) PCT Filed: Apr. 1, 2019

(86) PCT No.: PCT/CN2019/080750
§ 371 (c)(1),
(2) Date: Oct. 15, 2019

(87) PCT Pub. No.: WO2020/124859
PCT Pub. Date: Jun. 25, 2020

(65) Prior Publication Data
US 2021/0408498 A1 Dec. 30, 2021

(30) Foreign Application Priority Data
Dec. 17, 2018 (CN) .......................... 201811542380.6

(51) Int. Cl.
*H01L 51/52* (2006.01)
*H01L 27/32* (2006.01)

(52) U.S. Cl.
CPC ...... *H01L 51/5284* (2013.01); *H01L 27/3246* (2013.01)

(58) Field of Classification Search
USPC .............................................................. 257/40
See application file for complete search history.

(56) References Cited

U.S. PATENT DOCUMENTS

| | | | |
|---|---|---|---|
| 2003/0146695 A1* | 8/2003 | Seki | H01L 51/5284 313/506 |
| 2014/0354139 A1* | 12/2014 | Yoon | H01L 51/0005 313/498 |
| 2016/0155784 A1* | 6/2016 | Park | H01L 27/3246 257/88 |
| 2019/0027547 A1* | 1/2019 | Kim | H01L 51/56 |
| 2019/0206963 A1 | 7/2019 | Zhang et al. | |

FOREIGN PATENT DOCUMENTS

| | | |
|---|---|---|
| CN | 108091677 A | 5/2018 |
| CN | 108231840 A | 6/2018 |
| CN | 108630726 A | 10/2018 |
| CN | 108922914 A | 11/2018 |

* cited by examiner

*Primary Examiner* — Nduka E Ojeh
(74) *Attorney, Agent, or Firm* — Taft Stettinius & Hollister LLP

(57) ABSTRACT

A display panel and a display device are provided, wherein the display panel includes a substrate; a pixel definition layer is disposed on the substrate, wherein the pixel definition layer includes a plurality of pixel definition blocks disposed apart from each other; and a plurality of light-emitting units each are disposed between adjacent pixel definition blocks, wherein two sides of each light-emitting unit are provided with a shading part.

11 Claims, 2 Drawing Sheets

DISPLAY PANEL AND DISPLAY DEVICE WITH SHADING PART AT SIDE SURFACE OF PIXEL DEFINITION BLOCKS

CROSS-REFERENCE TO RELATED APPLICATIONS

This application is a U.S. National Phase of International PCT Application No. PCT/CN2019/080750 filed Apr. 1, 2019, which claims the benefit of Chinese Patent Application Serial No. 201811542380.6 filed Dec. 17, 2018, the contents of each application are incorporated herein by reference in their entirety.

BACKGROUND

1. Field of Invention

The present disclosure relates to the field of display technology, and more particularly to a display panel and a display device.

2. Description of the Prior Art

Organic light-emitting diodes (OLEDs) are current-controlled light-emitting devices. The OLEDs attract wide attention for its self-illumination, rich color, fast response, light weight, flexible display and other excellent characteristics.

In an OLED display panel, a circular polarizer is generally disposed on a light-emitting side to prevent a reflection of outdoor light, which can cause the OLED display panel to have a low contrast. However, for the light rays emitted by the OLED device itself, not all of light rays transmitted are in a direction perpendicular to a substrate of the OLED device. Some of the light rays are emitted sideward, which also causes the display panel to have a low contrast, thereby affecting a display effect.

SUMMARY

A main technical problem solved according to the present disclosure is how to improve a display effect of a display panel.

The present disclosure provides a display panel, including:
a substrate;
a pixel definition layer disposed on the substrate, wherein the pixel definition layer includes a plurality of pixel definition blocks disposed apart from each other;
a plurality of light-emitting units each disposed between adjacent pixel definition blocks, wherein two sides of each light-emitting unit are provided with a shading part;
wherein the substrate includes:
a base; and
a plurality of thin-film transistors disposed on the base, wherein a drain of each of the thin-film transistors is connected to a corresponding light-emitting unit;
wherein constituent materials of the shading part includes black resin.

According to the present disclosure, the display panel as claimed in the claim 1, wherein the plurality of pixel definition blocks each include a first end part and a second end part disposed oppositely to each other, and a side part disposed between the first end part and the second end part; wherein the shading part is disposed along the side part.

According to the present disclosure, the plurality of light-emitting units each include an anode, a light-emitting layer, and a cathode laminated on each other in sequence, and wherein the shading part is disposed on the anode, and the shading part is disposed between the side part and the light-emitting layer.

According to the present disclosure, the shading part is disposed around the light-emitting layer and the cathode.

According to the present disclosure, a plurality of grooves are disposed continuously in a side of the side part towards to a corresponding light-emitting unit, and the shading part is filled in the plurality of grooves.

According to the present disclosure, the shading part includes a plurality of shading blocks, and the plurality of shading blocks are filled in the plurality of grooves.

According to the present disclosure, the plurality of shading blocks are fittingly received in the plurality of grooves to fill the plurality of grooves correspondingly, to thereby make the side of the side part towards to a corresponding light-emitting unit be a flat and smooth surface.

The present disclosure provides a display panel, including:
a substrate;
a pixel definition layer disposed on the substrate, wherein the pixel definition layer includes a plurality of pixel definition blocks disposed apart from each other;
a plurality of light-emitting units each disposed between adjacent pixel definition blocks, wherein two sides of each light-emitting unit are provided with a shading part.

According to the present disclosure, the plurality of light-emitting units each include an anode, a light-emitting layer, and a cathode laminated on each other in sequence, and wherein the shading part is disposed on the anode, and the shading part is disposed between the side part and the light-emitting layer.

According to the present disclosure, the light-emitting units each include an anode, a light-emitting layer, and a cathode laminated on each other in sequence, and wherein the shading part is disposed on the anode, and the shading part is disposed between the side part and the light-emitting layer.

According to the present disclosure, the shading part is disposed around the light-emitting layer and the cathode.

According to the present disclosure, a plurality of grooves are disposed continuously in a side of the side part towards to a corresponding light-emitting unit, and the shading part is filled in the plurality of grooves.

According to the present disclosure, the shading part includes a plurality of shading blocks, and the plurality of shading blocks are filled in the plurality of grooves.

According to the present disclosure, the plurality of shading blocks are fittingly received in the plurality of grooves to fill the plurality of grooves correspondingly, to thereby make the side of the side part towards to a corresponding light-emitting unit be a flat and smooth surface.

According to the present disclosure, constituent materials of the shading part includes black resin.

According to the present disclosure, the substrate including:
a base; and
a plurality of thin-film transistors disposed on the base, wherein a drain of each of the thin-film transistors is connected to a corresponding light-emitting unit.

The present disclosure provides a display device including a display panel, wherein the display panel includes:
a substrate;

a pixel definition layer disposed on the substrate, wherein the pixel definition layer includes a plurality of pixel definition blocks disposed apart from each other;

a plurality of light-emitting units each disposed between adjacent pixel definition blocks, wherein two sides of each light-emitting unit are provided with a shading part.

According to the present disclosure, the plurality of pixel definition blocks each include a first end part and a second end part disposed oppositely to each other, and a side part disposed between the first end part and the second end part; wherein the shading part is disposed along the side part.

According to the present disclosure, the plurality of light-emitting units each include an anode, a light-emitting layer, and a cathode laminated on each other in sequence, and wherein the shading part is disposed on the anode, and the shading part is disposed between the side part and the light-emitting layer.

According to the present disclosure, the shading part is disposed around the light-emitting layer and the cathode.

Beneficial effects of the present disclosure are that two sides of each light-emitting unit are provided with the shading part to prevent lights emitted from the light-emitting unit emitting towards the two sides of each light-emitting unit, thereby improve the display effects of the display panel.

BRIEF DESCRIPTION OF DRAWINGS

In order to more clearly illustrate technical solutions in the embodiments of the present disclosure, following drawings will be described in the embodiments of the present disclosure.

DETAILED DESCRIPTION OF PREFERRED EMBODIMENTS

Figure 1:
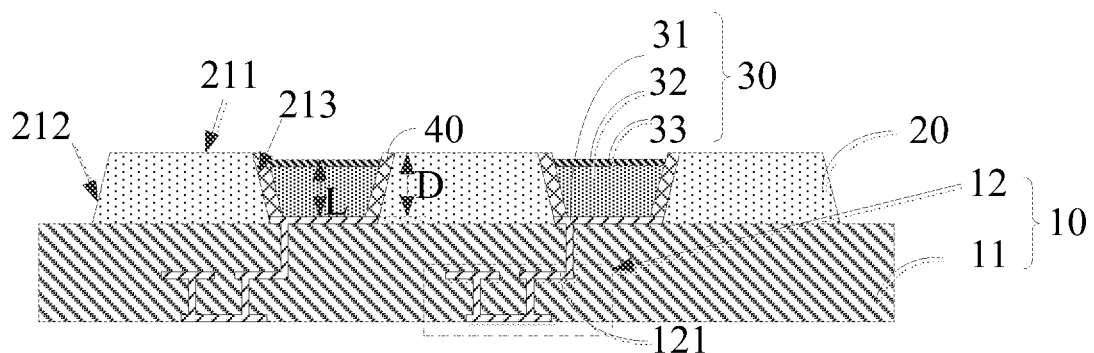
FIG. 1 is a structural schematic diagram of a display device according to a first embodiment of the present disclosure.

Reference will be made in detail to embodiments of the present disclosure. The same or similar elements and the elements having same or similar functions are denoted by like reference numerals throughout the descriptions. The embodiments described herein with reference to drawings are explanatory, illustrative, and used to generally understand the present disclosure. The embodiments shall not be construed to limit the present disclosure.

As shown in FIG. 1, FIG. 1 is a structural schematic diagram of a display panel according to a first embodiment of the present disclosure.

The present disclosure provides a display panel 1 including a substrate 1, a pixel definition layer 20, and a plurality of light-emitting units 30. The pixel definition layer 20 is disposed on the substrate 10. The pixel definition layer 20 includes a plurality of pixel definition blocks 21 disposed apart from each other. A plurality of light-emitting units 30 are disposed between adjacent pixel definition blocks 21. Two sides of each light-emitting unit 30 are provided with a shading part 40.

The substrate 10 is a flexible substrate or a hard substrate. The substrate 10 can include various circuit structures or substrate structures based on practical requirements. For example, the substrate 10 can include a base 11 and a plurality of thin-film transistors 12. The plurality of thin-film transistors 12 are disposed on the base 11, wherein a drain 121 of each of the thin-film transistors 12 is connected to a corresponding light-emitting unit 30.

The plurality of pixel definition blocks 21 apart from each other are disposed on the substrate 10. The pixel definition layer 20 can be fabricated on the substrate 10 in advance by an ink-jet printing process. And then, the plurality of pixel definition blocks 21 can be formed by accurately determining an ink droplet volume and injecting ink droplets each having the determined volume into defined regions, respectively. Constituent materials of the pixel definition blocks 21 include hydrophobic materials, and a shape of a longitudinal section of the pixel definition block 21 can be a trapezoid. When the shape of the longitudinal section of the pixel definition block 21 is a trapezoid, an aperture ration of the display panel 1 can be increased, thereby improving the display effect. Of course, the shape of the longitudinal section of the pixel definition block 21 can be a rectangle, which can be disposed based on practical requirements.

Besides, the plurality of light-emitting units 30 each are disposed between adjacent pixel definition blocks 21. Two sides of each light-emitting units 30 are provided with a shading part 40. Constituent materials of the shading part 40 can include black resin. When the display panel 1 is in a working state, lights generated by the plurality of light-emitting units 30 cannot emit from two sides of each of the plurality of light-emitting units 30 because two sides of each light-emitting units 30 are provided with the shading part 40. Therefore, the contrast of the display panel 1 can be improved, thereby improving the display effect of the display panel 1.

Continue to refer to FIG. 1; as shown in FIG. 1, the plurality of pixel definition blocks 21 each include a first end part 211 and a second end part 212 disposed opposite to each other, and a side part 213 disposed between the first end part 211 and the second end part 212. The shading part 40 is disposed along the side part 213. The plurality of light-emitting units 30 each include an anode 31, a light-emitting layer 32, and a cathode 33 laminated on each other in sequence. The shading part 40 is disposed on the anode 31, and the shading part 40 is disposed between the side part 213 and the light-emitting layer 32.

It can be noted that the shading part 40 is disposed around the light-emitting layer 32 and the cathode 33. For example, the shading part 40 is disposed along the side part 213 and disposed between the side part 213 and the light-emitting layer 32. A distance D between an end of the shading part 40 away from the anode 31 and the anode 31 is greater than a distance L between the cathode 33 and the anode 31, as shown in FIG. 1. Therefore, the contrast of the display panel 1 can be improved, thereby improving the display effect of the display panel 1.

Figure 2:
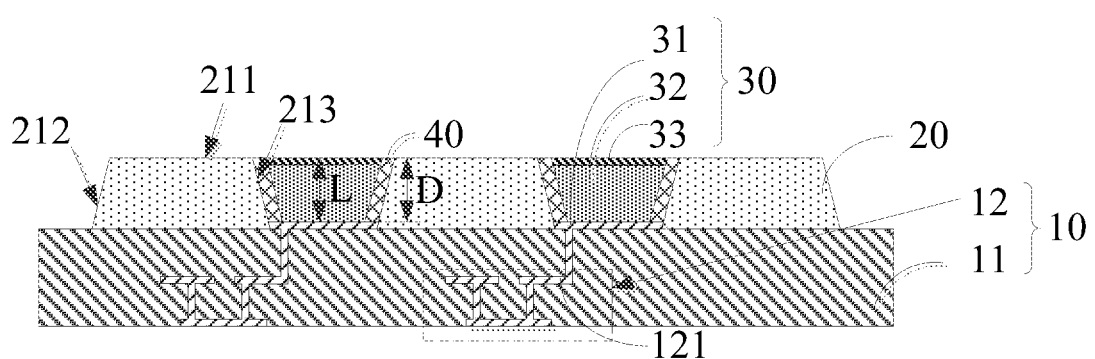
FIG. 2 is a structural schematic diagram of a display device according to a second embodiment of the present disclosure.

According to some embodiments, please refer to FIG. 2; FIG. 2 is a structural diagram of a second embodiment of a display panel according to the present disclosure. The present disclosure also provides a display panel 1. A distinguish between the display panel 1 in FIG. 2 and the display panel 1 in FIG. 1 is that the distance D between the end of the shading part 40 away from the anode 31 and the anode 31 is equal to the distance L between the cathode 33 and the anode 31. That is the end of the shading part 40 away from the anode 31 is flush with a surface of the cathode 33.

When the display panel 1 is in a working state, lights generated by the plurality of light-emitting units 30 cannot emit from two sides of the light-emitting unit 30 because the two sides of each light-emitting units 30 are provided with the shading part 40. Therefore, the contrast of the display panel 1 can be improved, thereby improving the display effect of the display panel 1.

In addition, amount of materials for forming the shading part 40 during the fabrication process of the shading part 40 can be reduced, since the distance D between the end of the shading part 40 away from the anode 31 and the anode 31 is equal to the distance L between the cathode 33 and the anode 31. Therefore, a purpose of reducing a production cost can be achieved.

Figure 3:
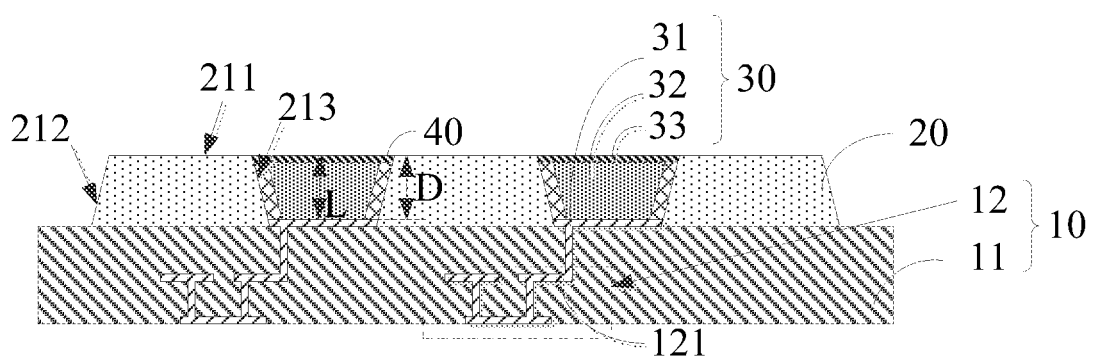
FIG. 3 is a structural schematic diagram of a display device according to a third embodiment of the present disclosure.

According to another embodiment, please refer to FIG. 3; FIG. 3 is a structure diagram of a third embodiment of a display panel according to the present disclosure. The present disclosure also provides a display panel 1. A distinguish between the display panel 1 in FIG. 3 and the display panel 1 in FIG. 1 is that the shading part can be dispose between the anode 31 and the cathode 33.

For example, the shading part 40 can be disposed between the anode 31 and the cathode 33, and the shading part 40, the anode 31 and the cathode 33 are disposed around the light-emitting layer 32. The light-emitting layer 32 can emit lights by an interaction between the anode 31 and the cathode 33. Therefore, by disposing the shading part 40 between the anode 31 and the cathode 33, when the display panel 1 is in a working state, lights generated by the plurality of light-emitting units 30 also cannot emit from two sides of the light-emitting unit 30 because two sides of each light-emitting unit 30 are provided with the shading part 40. Therefore, the contrast of the display panel 1 can be improved, thereby improving the display effect of the display panel 1. Besides, the amount used for forming the shading part 40 can be reduced, thereby lowering the manufacturing cost.

Figure 4:
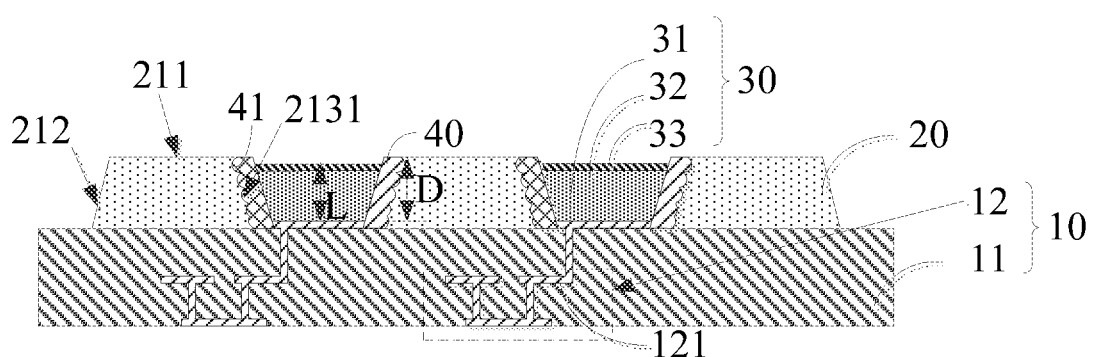
FIG. 4 is a structural schematic diagram of a display device according to a fourth embodiment of the present disclosure.

Please refer to FIG. 4; FIG. 4 is a structural schematic diagram of a fourth embodiment of a display panel according to the present disclosure. The present disclosure also provides a display panel 1. Distinguishes between the display panel 1 in FIG. 4 and the display panel 1 in FIG. 1 are in that: a plurality of grooves 2131 are disposed continuously in a side of the side part 213 of the pixel definition blocks 21 facing towards to a corresponding light-emitting unit 30, and the shading part fills the plurality of grooves 1231. The shading part 40 includes a plurality of shading blocks 41, and the plurality of shading blocks 41 fill the plurality of grooves 2131. The plurality of shading blocks 41 are fittingly received in the plurality of grooves 1231 to fill the plurality of grooves correspondingly, to thereby make the side of the side part 213 facing towards to a corresponding light-emitting unit 30 be a flat and smooth surface.

First, the side part 213 of each of the plurality of pixel definition blocks 21 can be provided with the plurality of grooves 2131. And then, the plurality of shading blocks 41 are received in the plurality of grooves 2131. Since the plurality of grooves 2131 are disposed continuously, a shading film can be cooperatively formed by sides of the shading blocks 41 located close to a corresponding light-emitting unit 30. Thus, not only a contrast of the display panel 1 can be prevented from being lowered, but also an adhesion between the shading part 40 and a corresponding pixel definition block 21 can be improved, thereby improving the yield of the display panel 1.

Besides, it only needs to coat shading materials along the plurality of grooves 2131 to from the plurality of shading blocks 41 in the plurality of grooves 2131 when fabricating the shading part 40, since the plurality of grooves 2131 have been disposed on the side part of each of the plurality of pixel definition blocks 21. Thus, not only a fabricating process can be simplified, but also a problem of a too small light-emitting region caused by a too thick shading part 40 can be improved.

It can be noted that each of the plurality of shading blocks 41 is corresponding to a groove 2131, and a shape of a longitudinal section of the shading block 41 is accordance with a shape of a depression region of the groove 2131 corresponding to the shading block 41. For example, the shape of the longitudinal section of the shading block 41 is a rectangle. A length of the longitudinal section is 6 micron, and a width of the longitudinal section is 3 micron. The shape of the depression region of the groove 2131 corresponding to the shading block 41 is also a rectangle. A length of the depression region is 6 micron, and a width of the depression region is 3 micron. Besides, a number of the grooves 2131 can be determined according to practical requirements. Drawings are only illustrative and shall not be construed to limit the present disclosure.

Accordingly, the present disclosure also provides a display device. The display device includes the display panel 1. The display panel 1 is referred to the previous embodiments, and details are not described herein.

The present disclosure is described in detail in accordance with the above contents with the specific preferred examples. However, this present disclosure is not limited to the specific examples. For a person of ordinary skill in the art, on the premise of keeping the conception of the present disclosure, the technical personnel can also make simple deductions or replacements, all of which should be considered to belong to the protection scope of the present disclosure.

What is claimed is:
1. A display panel, comprising:
a substrate;
a pixel definition layer disposed on the substrate, wherein the pixel definition layer comprises a plurality of pixel definition blocks disposed apart from each other, each of the plurality of pixel definition blocks comprises a first end part and a second end part disposed opposite to each other and a side part disposed between the first end part and the second end part;
a plurality of light-emitting units each disposed between adjacent pixel definition blocks, wherein two sides of each light-emitting unit are provided with a shading part disposed along the side part;
wherein a plurality of grooves are defined continuously in a side of the side part toward a corresponding light-emitting unit, and the shading part is filled in the plurality of grooves;
the shading part comprises a plurality of shading blocks filled in the plurality of grooves, and the plurality of shading blocks are fittingly received in the plurality of grooves to fill the plurality of grooves correspondingly, and the side of the side part toward the corresponding light-emitting unit is a flat and smooth surface;
wherein the substrate comprises:
a base; and a plurality of thin-film transistors disposed on the base, wherein a drain of each of the thin-film transistors is connected to the corresponding light-emitting unit; and wherein constituent materials of the shading part comprise black resin.

2. The display panel as claimed in claim 1, wherein each of the plurality of light-emitting units comprises an anode, a light-emitting layer, and a cathode laminated on each other in sequence, and the shading part is disposed on the anode and between the side part and the light-emitting layer.

3. The display panel as claimed in claim 2, wherein the shading part is disposed around the light-emitting layer and the cathode.

4. A display panel, comprising:
   a substrate;
   a pixel definition layer disposed on the substrate, wherein the pixel definition layer comprises a plurality of pixel definition blocks disposed apart from each other, each of the plurality of pixel definition blocks comprises a first end part and a second end part disposed opposite to each other and a side part disposed between the first end part and the second end part;
   a plurality of light-emitting units each disposed between adjacent pixel definition blocks, wherein two sides of each light-emitting unit are provided with a shading part disposed along the side part;
   wherein a plurality of grooves are defined continuously in a side of the side part toward a corresponding light-emitting unit, and the shading part is filled in the plurality of grooves; and
   the shading part comprises a plurality of shading blocks filled in the plurality of grooves, and the plurality of shading blocks are fittingly received in the plurality of grooves to fill the plurality of grooves correspondingly, and the side of the side part toward the corresponding light-emitting unit is a flat and smooth surface.

5. The display panel as claimed in claim 4, wherein each of the light-emitting units comprises an anode, a light-emitting layer, and a cathode laminated on each other in sequence, and the shading part is disposed on the anode and between the side part and the light-emitting layer.

6. The display panel as claimed in claim 5, wherein the shading part is disposed around the light-emitting layer and the cathode.

7. The display panel as claimed in claim 4, wherein constituent materials of the shading part comprise black resin.

8. The display panel as claimed in claim 4, wherein the substrate comprises:
   a base; and
   a plurality of thin-film transistors disposed on the base, wherein a drain of each of the thin-film transistors is connected to the corresponding light-emitting unit.

9. A display device, comprising a display panel, wherein the display panel comprises:
   a substrate;
   a pixel definition layer disposed on the substrate, wherein the pixel definition layer comprises a plurality of pixel definition blocks disposed apart from each other, each of the plurality of pixel definition blocks comprises a first end part and a second end part disposed opposite to each other and a side part disposed between the first end part and the second end part;
   a plurality of light-emitting units each disposed between adjacent pixel definition blocks, wherein two sides of each light-emitting unit are provided with a shading part disposed along the side part;
   wherein a plurality of grooves are defined continuously in a side of the side part toward a corresponding light-emitting unit, and the shading part is filled in the plurality of grooves; and
   the shading part comprises a plurality of shading blocks filled in the plurality of grooves, and the plurality of shading blocks are fittingly received in the plurality of grooves to fill the plurality of grooves correspondingly, and the side of the side part toward the corresponding light-emitting unit is a flat and smooth surface.

10. The display panel as claimed in claim 9, wherein each of the plurality of light-emitting units comprises an anode, a light-emitting layer, and a cathode laminated on each other in sequence, and the shading part is disposed on the anode and between the side part and the light-emitting layer.

11. The display panel as claimed in claim 10, wherein the shading part is disposed around the light-emitting layer and the cathode.

\* \* \* \* \*